(12) United States Patent
Patil et al.

(10) Patent No.: US 10,319,642 B2
(45) Date of Patent: Jun. 11, 2019

(54) HETEROGENEOUS INTEGRATION OF 3D SI AND III-V VERTICAL NANOWIRE STRUCTURES FOR MIXED SIGNAL CIRCUITS FABRICATION

(71) Applicant: GLOBALFOUNDRIES Inc., Grand Cayman (KY)

(72) Inventors: Suraj Kumar Patil, Ballston Lake, NY (US); Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/667,305

(22) Filed: Aug. 2, 2017

(65) Prior Publication Data

US 2018/0012812 A1 Jan. 11, 2018

Related U.S. Application Data

(62) Division of application No. 15/205,535, filed on Jul. 8, 2016, now Pat. No. 9,754,843.

(51) Int. Cl.
*H01L 21/8234* (2006.01)
*H01L 29/66* (2006.01)
(Continued)

(52) U.S. Cl.
CPC .. *H01L 21/823885* (2013.01); *H01L 21/0243* (2013.01); *H01L 21/02381* (2013.01);
(Continued)

(58) Field of Classification Search
CPC .......... H01L 21/823885; H01L 27/092; H01L 29/0676; H01L 29/78642; H01L 29/78696;
(Continued)

(56) References Cited

U.S. PATENT DOCUMENTS 8,932,940 B2 1/2015 Wang et al.
9,515,073 B1 * 12/2016 Jagannathan ..... H01L 29/66545
(Continued)

OTHER PUBLICATIONS

Hocevar et al., "Growth and Optical Properties of Axial Hybrid III-V/Si Nanowires", Materials Science, 2012, retrieved on Jun. 7, 2017 from https://arxiv.org/ftp/arxiv/papers/1210/1210.8350.pdf, 32 Pages.
(Continued)

*Primary Examiner* — Marcos D. Pizarro
*Assistant Examiner* — Nelson Garces
(74) *Attorney, Agent, or Firm* — Ditthavong & Steiner, P.C.

(57) ABSTRACT

A method of forming Si or Ge-based and III-V based vertically integrated nanowires on a single substrate and the resulting device are provided. Embodiments include forming first trenches in a Si, Ge, III-V, or $Si_xGe_{1-x}$ substrate; forming a conformal SiN, $SiO_xC_yN_z$ layer over side and bottom surfaces of the first trenches; filling the first trenches with $SiO_x$; forming a first mask over portions of the Si, Ge, III-V, or $Si_xGe_{1-x}$ substrate; removing exposed portions of the Si, Ge, III-V, or $Si_xGe_{1-x}$ substrate, forming second trenches; forming III-V, III-$V_xM_y$, or Si nanowires in the second trenches; removing the first mask and forming a second mask over the III-V, III-$V_xM_y$, or Si nanowires and intervening first trenches; removing the $SiO_x$ layer, forming third trenches; and removing the second mask.

14 Claims, 11 Drawing Sheets

(51) Int. Cl.

| | | |
|---|---|---|
| *H01L 27/115* | (2017.01) | |
| *H01L 29/788* | (2006.01) | |
| *H01L 27/092* | (2006.01) | |
| *H01L 29/49* | (2006.01) | |
| *H01L 21/302* | (2006.01) | |
| *H01L 21/02* | (2006.01) | |
| *H01L 21/8238* | (2006.01) | |
| *H01L 29/06* | (2006.01) | |
| *H01L 29/786* | (2006.01) | |
| *H01L 29/423* | (2006.01) | |
| *H01L 21/8258* | (2006.01) | |

(52) U.S. Cl.
CPC .. *H01L 21/02387* (2013.01); *H01L 21/02389* (2013.01); *H01L 21/02392* (2013.01); *H01L 21/02395* (2013.01); *H01L 21/02532* (2013.01); *H01L 21/02538* (2013.01); *H01L 21/02603* (2013.01); *H01L 21/02639* (2013.01); *H01L 21/02653* (2013.01); *H01L 21/8258* (2013.01); *H01L 21/823807* (2013.01); *H01L 27/092* (2013.01); *H01L 29/0676* (2013.01); *H01L 29/42392* (2013.01); *H01L 29/66742* (2013.01); *H01L 29/78642* (2013.01); *H01L 29/78654* (2013.01); *H01L 29/78681* (2013.01); *H01L 29/78684* (2013.01); *H01L 29/78696* (2013.01); *H01L 21/0262* (2013.01)

(58) Field of Classification Search
CPC ......... H01L 29/78681; H01L 29/78684; H01L 21/0262; H01L 21/823807; H01L 21/02381; H01L 21/02392; H01L 21/02395; H01L 21/02389; H01L 21/02603; H01L 29/42392; H01L 29/66522; H01L 29/20–2006; H01L 27/2454; H01L 29/7827; H01L 21/823487; H01L 21/8258

See application file for complete search history.

(56) References Cited

U.S. PATENT DOCUMENTS

| | | | | |
|---|---|---|---|---|
| 2015/0145042 | A1* | 5/2015 | Bu | ............ H01L 27/1211 257/347 |
| 2015/0145057 | A1 | 5/2015 | Fan et al. | |
| 2016/0181272 | A1* | 6/2016 | Rabkin | ............ H01L 21/02653 438/268 |
| 2016/0284723 | A1* | 9/2016 | Rabkin | ............ H01L 27/11582 |

OTHER PUBLICATIONS

Tomioka et al., "Integration of III-V Nanowires on Si: From High-Performance Vertical FET to Steep-Slope Switch", Electron Devices Meeting (IEDM), IEEE International, Dec. 9-11, 2013, pp. 88-91.

Borg et al., "Vertical III-V Nanowire Device Integration on Si (100)", Nano Letters, vol. 14, No. 4, Mar. 14, 2014, retrieved on Jun. 7, 2017 from http://http://pubs.acs.org/doi/abs/10.1021/nl404743j, 2 Pages.

* cited by examiner

HETEROGENEOUS INTEGRATION OF 3D SI AND III-V VERTICAL NANOWIRE STRUCTURES FOR MIXED SIGNAL CIRCUITS FABRICATION

RELATED APPLICATION

This application is a divisional of U.S. patent application Ser. No. 15/205,535, filed Jul. 8, 2016, entitled "HETEROGENEOUS INTEGRATION OF 3D SI AND III-V VERTICAL NANOWIRE STRUCTURES FOR MIXED SIGNAL CIRCUITS FABRICATION," which is incorporated herein by reference in its entirety.

TECHNICAL FIELD

The present disclosure relates to methods of manufacturing complimentary metal-oxide-semiconductor (CMOS) devices. The present disclosure is particularly applicable to field effect transistor (FET) structures with vertical nanowire channels.

BACKGROUND

Traditionally, CMOS fabrication has been divided into digital and analog device fabrication techniques. Known electronic devices employ separate digital and analog chips having different (i) substrate, (ii) voltage, (iii) frequency, and (iv) fabrication requirements, all of which increase chip real estate demands and fabrication complexity.

Reducing the supply voltage of high performance FETs is a known effective approach for power scaling. In addition, silicon (Si)-based CMOS technologies require gate-architecture changes to suppress the short-channel effect and OFF-state leakage current. Further, using different channel materials is known to enhance the ON-state current at a lower electrical field and, therefore, enable lower power consumption.

A need therefore exists for methodology enabling fabrication of integrated digital and analog circuits on a single substrate that is scalable and compatible with current integrated circuit (IC) fabrication technology, and the resulting device.

SUMMARY

An aspect of the present disclosure is a method of forming Si or germanium (Ge)-based and material group III-V-based vertically integrated nanowires on a single substrate.

Another aspect of the present disclosure is a Si or Ge-based and III-V-based vertically integrated CMOS nanowire device formed on a single substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first trenches in a Si, Ge, III-V, or silicon germanium ($Si_xGe_{1-x}$) substrate; forming a conformal silicon nitride (SiN), $SiO_xC_yN_z$, or direct plasma nitride (DPN) layer over side and bottom surfaces of the first trenches; filling the first trenches with silicon oxide ($SiO_x$); forming a first mask over portions of the Si, Ge, III-V, or $Si_xGe_{1-x}$ substrate; removing exposed portions of the Si, Ge, III-V, or $Si_xGe_{1-x}$ substrate, forming second trenches; forming III-V, III-$V_xM_y$, or Si nanowires in the second trenches; removing the first mask and forming a second mask over the III-V, III-$V_xM_y$, or Si nanowires and intervening first trenches; removing the $SiO_x$ layer, forming third trenches; and removing the second mask.

Aspects of the present disclosure include doping an upper 50 nanometer (nm) to 500 nm of the Si, Ge, III-V, or $Si_xGe_{1-x}$ substrate prior to forming the first trenches. Other aspects include forming the first trenches by: forming a preliminary SiN layer over the Si, Ge, III-V, or $Si_xGe_{1-x}$ substrate; forming a silicon dioxide ($SiO_2$) layer over the preliminary SiN layer; patterning the $SiO_2$ and preliminary SiN layers; and etching a portion of the Si, Ge, III-V, or $Si_xGe_{1-x}$ substrate through the patterned preliminary SiN and $SiO_2$ layers. Further aspects include removing the $SiO_2$ and preliminary SiN layers prior to forming the SiN and $SiO_x$ layers in the trenches. Another aspect includes, wherein the substrate is formed of Si, Ge, or $Si_xGe_{1-x}$, forming the III-V or III-$V_xM_y$ nanowires by: depositing an aluminum (Al), nickel (Ni), or gallium (Ga) nanoparticle in each second trench by self-assembly in sol-gel or by direct deposit; and growing the III-V or III-$V_xM_y$ nanowires to a desired height by a metal catalyst vertical vapor liquid solid (VLS) growth or chemical vapor deposition (CVD). Additional aspects include the metal catalyst being formed of Ni, Al, gold (Au), silver (Ag), titanium (Ti), erbium (Er), platinum (Pt), palladium (Pd), indium (In), Tin (Sn), antimony (Sb), Zirconium (Zr), vanadium (V), hafnium (Hf), tungsten (W), cobalt (Co), tantalum (Ta), lanthanum (La), ruthenium (Ru), molybdenum (Mo), Ga, or iron (Fe). Other aspects include wherein the III-V or III-$V_xM_y$ nanowires are not grown to a full width of the second trenches, forming an oxide or nitride layer between each III-V or III-$V_xM_y$ nanowire and sidewalls of the corresponding second trench. Further aspects include wherein the substrate is formed of III-V, forming the Si nanowires by: depositing a Ni or Au nanoparticle in each second trench by self-assembly in sol-gel, metal organic chemical vapor deposition (MOCVD), or atomic layer growth (ALD); and growing the Si nanowires to a desired height.

Another aspect of the present disclosure is a method including: forming a substrate stack including an amorphous silicon (a-Si) followed by n or p doping or doped polysilicon (poly-Si) layer, and a silicon oxycarbide (SiOC) layer; forming first and second groups of trenches in the substrate stack down to the doped a-Si or poly Si layer of the substrate stack; forming a first mask over the second group of trenches; forming Si, Ge or $Si_xGe_{1-x}$ nanowires in the first group of trenches; removing the first mask and forming a second mask over the Si, Ge, or $Si_xGe_{1-x}$ nanowires; forming III-V or III-$V_xM_y$ nanowires in the second group of trenches; removing the second mask; and planarizing the Si, Ge, or $Si_xGe_{1-x}$ and III-V or III-$V_xM_y$ nanowires down to the SiOC layer.

Aspects of the present disclosure include forming the substrate stack by: forming a Si substrate; forming a buffer oxide layer over the Si substrate; forming the a-Si or doped poly-Si layer over the oxide layer; forming a first SiN layer over the a-Si or doped poly-Si layer; forming the SiOC layer over the first SiN layer; and forming a second SiN layer over the SiOC layer. Other aspects include forming the trenches within the substrate stack by: self-aligned double patterning (SADP) or self-aligned quadruple patterning (SAQP), direct surface assembly (nanoimprint), or extreme ultraviolet (EUV) lithography. Further aspects include forming the Si, Ge, or $Si_xGe_{1-x}$ nanowires by: depositing a Ni or Au nanoparticle in each of the first group of trenches by self-assembly in sol-gel or by metal organic chemical vapor deposition (MOCVD), atomic layer growth (ALD); and growing the Si, Ge, or $Si_xGe_{1-x}$ nanowires to a desired height. Another aspect includes forming the III-V or III-$V_xM_y$ nanowires by: depositing an Al, Ni, or Ga nanoparticle in each of the second group of trenches by self-assembly in sol-gel or by MOCVD, ALD; growing the III-V or III-$V_xM_y$ nanowires to a desired height by a metal catalyst vertical VLS growth, chemical vapor deposition (CVD) growth with in-situ doping during growth; and removing the second mask prior to planarizing the Si, Ge, or $Si_xGe_{1-x}$ and III-V or III-$V_xM_y$ nanowires. Additional aspects include forming the III-V or III-$V_xM_y$ nanowires of a combination of indium phosphide (InP), indium arsenide (InAs), gallium nitride (GaN), or gallium arsenide (GaAs). Other aspects include the metal catalyst being formed of Ni, Al, Au, Ag, Ti, Er, Pt, Pd, In, Sn, Sb, Zr, V, Hf, W, Co, Ta, La, Ru, Mo, Ga, or Fe.

A further aspect of the present disclosure is a device including: a substrate; a first group of Si or Ge-based vertically integrated nanowires formed on the substrate; and a second group of III-V-based vertically integrated nanowires formed on the substrate, separated from the first group, the first and second groups of vertically integrated nanowires being formed of heterogeneous materials.

Aspects of the device include the substrate being formed of Si, SiGe, III-V, a combination thereof, or a substrate stack. Other aspects include the substrate stack being formed of sequential layers of silicon, oxide, a-Si or doped poly-Si, SiN, SiOC, and $SiO_xC_yN_z$. Further aspects include the first group of Si or Ge-based vertically integrated nanowires being formed of Si, Ge or $Si_xGe_{1-x}$. Additional aspects include the second group of III-V-based vertically integrated nanowires being formed of III-V or III-$V_xM_y$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of having different (i) substrate, (ii) voltage, (iii) frequency, and (iv) fabrication requirements for digital and analog chips and resulting increased chip real estate demands and fabrication complexity attendant upon fabricating traditional CMOS devices.

Methodology in accordance with embodiments of the present disclosure includes forming first trenches in a Si, Ge, III-V, or $Si_xGe_{1-x}$ substrate. A conformal SiN, $SiO_xC_yN_z$, or DPN layer is formed over side and bottom surfaces of the first trenches. The first trenches are filled with $SiO_x$, and a first mask is formed over portions of the Si, Ge, III-V, or $Si_xGe_{1-x}$ substrate. Exposed portions of the Si, Ge, III-V, or $Si_xGe_{1-x}$ substrate are removed, forming second trenches. III-V, III-$V_xM_y$, or Si nanowires are then formed in the second trenches. The first mask is removed, and a second mask is formed over the III-V, III-$V_xM_y$, or Si nanowires and intervening first trenches. The $SiO_x$ layer is removed, forming third trenches, and the second mask is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
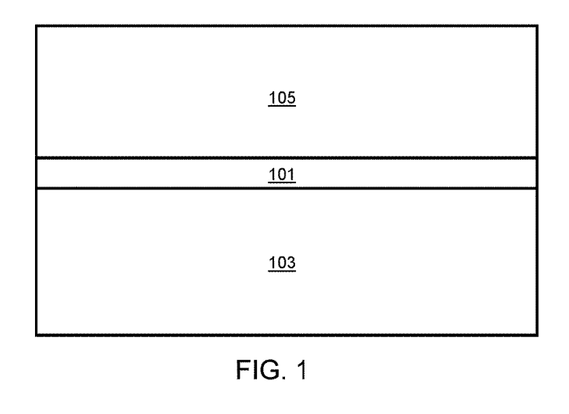
FIGS. 1 through 14 schematically illustrate a process flow for forming Si or Ge-based and III-V-based vertically integrated nanowires on a single substrate for mixed signal circuits, in accordance with an exemplary embodiment.
Figure 2:
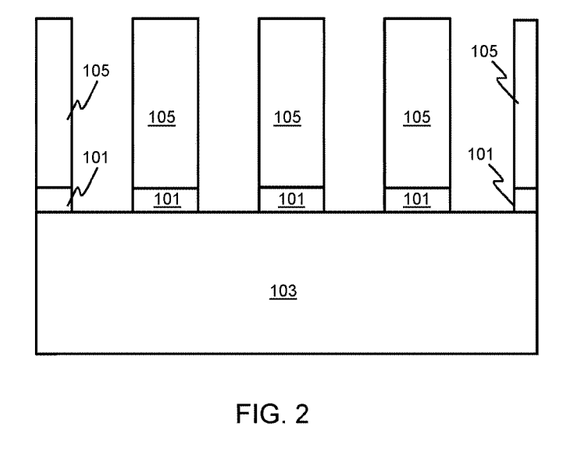
Figure 3:
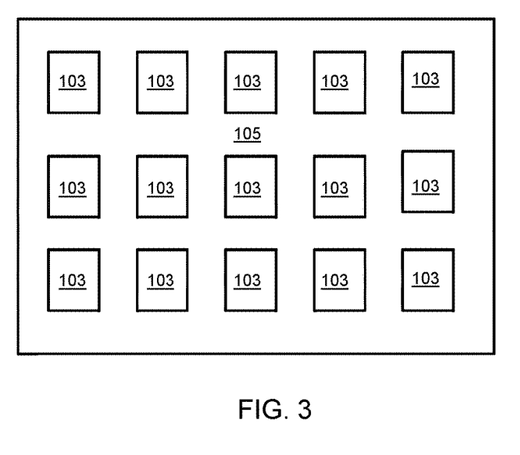
Figure 11:
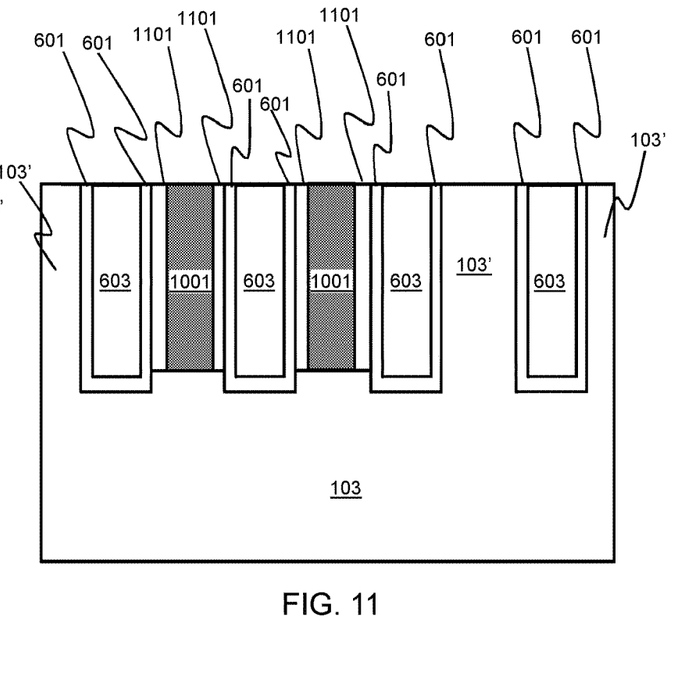
Figures 12, 13:
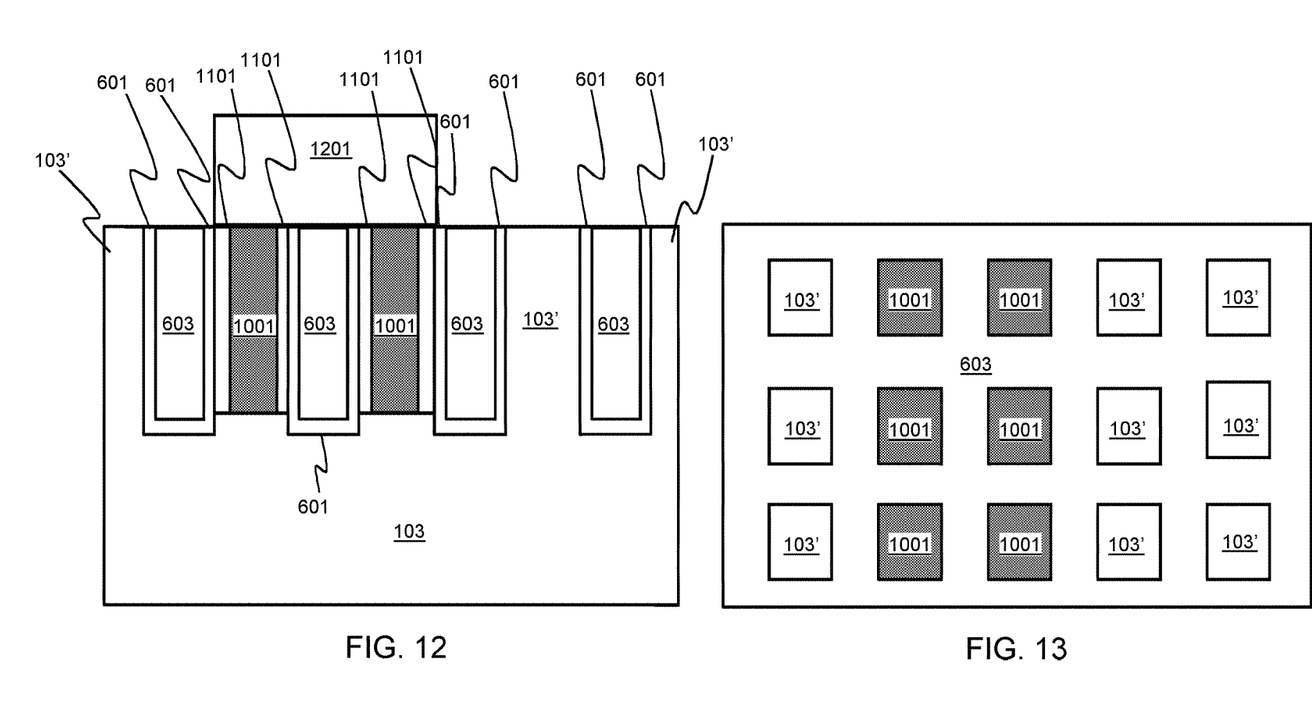

FIGS. 1 through 14 schematically illustrate a process flow for forming Si or Ge-based and III-V-based vertically integrated nanowires on a single substrate for mixed signal circuits, in accordance with an exemplary embodiment. FIGS. 1, 2, 4 through 12, and 14 are cross-sectional views, and FIGS. 3 and 13 are top views. Adverting to FIG. 1, a SiN layer 101 is deposited, e.g., to a thickness of 2 nm to 30 nm, over a Si, Ge, or $Si_xGe_{1-x}$ substrate 103. The upper 50 nm to 500 nm of the Si, Ge, or $Si_xGe_{1-x}$ substrate 103 may be doped n+ or p+ prior to forming the SiN layer 101. The Si, Ge, or $Si_xGe_{1-x}$ substrate 103 may be doped, e.g., to form a conducting region for later contact formation for source-drain definitions. Next, a $SiO_2$ layer 105 is deposited, e.g., to a thickness of 100 nm to 300 nm, over the SiN layer 101. The SiN and $SiO_2$ layers 101 and 105, respectively, are then patterned, e.g., by reactive ion etching (RIE), as depicted in FIGS. 2 and 3.

Figure 4:
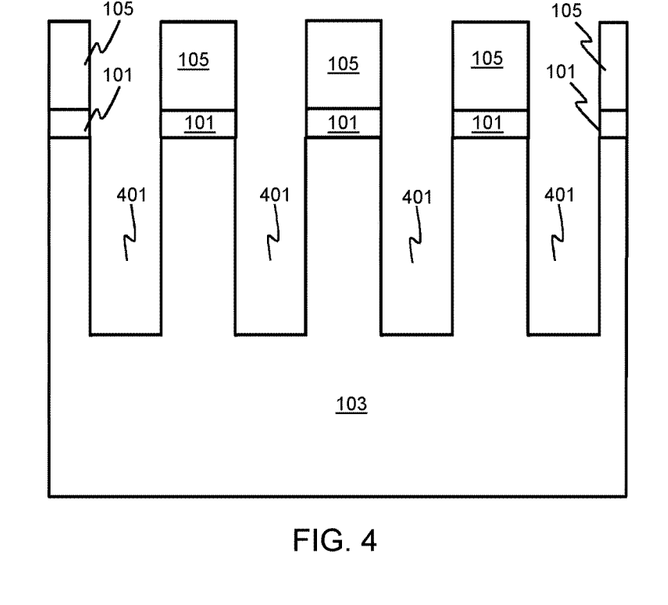
Figure 5:
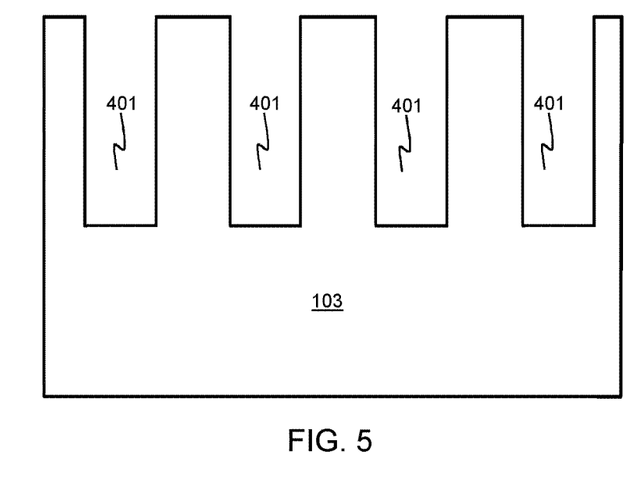

Adverting to FIG. 4, the Si, Ge, or $Si_xGe_{1-x}$ substrate 103 is etched, e.g., to a depth of 10 nm to 50 nm, forming trenches 401. The Si, Ge, or $Si_xGe_{1-x}$ substrate 103 may be etched, e.g., with plasma based species including, but not limited to, bromine trifluoride ($BrF_3$), chlorine trifluoride ($ClF_3$), tetrafluoromethane ($CF_4$), or fluoroform ($CHF_3$), hydrogen fluoride (HF), boron trichloride ($BCl_3$), boron trifluoride ($BF_3$), and sulphur hexafluoride ($SF_6$). The SiN and $SiO_2$ layers 101 and 105, respectively, are then removed, as depicted in FIG. 5. Adverting to FIG. 6, a conformal SiN, $SiO_xC_yN_z$, or DPN layer 601 is then deposited on the side and bottom surfaces of the trenches 401, e.g., to a thickness of 1 nm to 10 nm, and the remainder of the trenches 401 is filled with a $SiO_x$ layer 603. The $SiO_x$ layer 603 is then planarized, e.g., by CMP, down to the Si, Ge, or $Si_xGe_{1-x}$ substrate 103, thereby defining the Si, Ge, or $Si_xGe_{1-x}$ nanowires 103'. Alternatively, the SiN, $SiO_xC_yN_z$, or DPN layer 601 and $SiO_x$ layer 603 may be deposited without first removing the SiN and $SiO_2$ layers 101 and 105, respectively. Thereafter, all of the layers 601, 603, 101, and 105 may be planarized, e.g., by CMP, down to the Si, Ge, or $Si_xGe_{1-x}$ substrate 103, thereby defining the Si, Ge, or $Si_xGe_{1-x}$ nanowires 103'.

Figure 7:
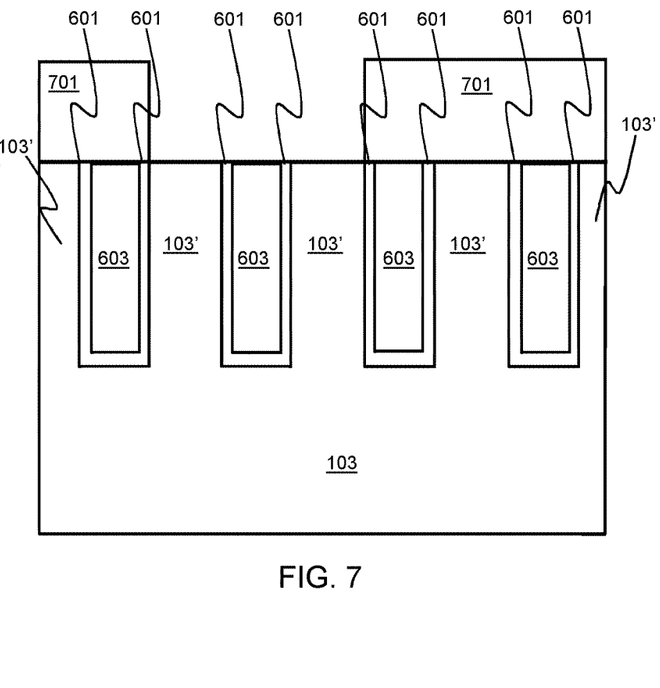
Figure 8:
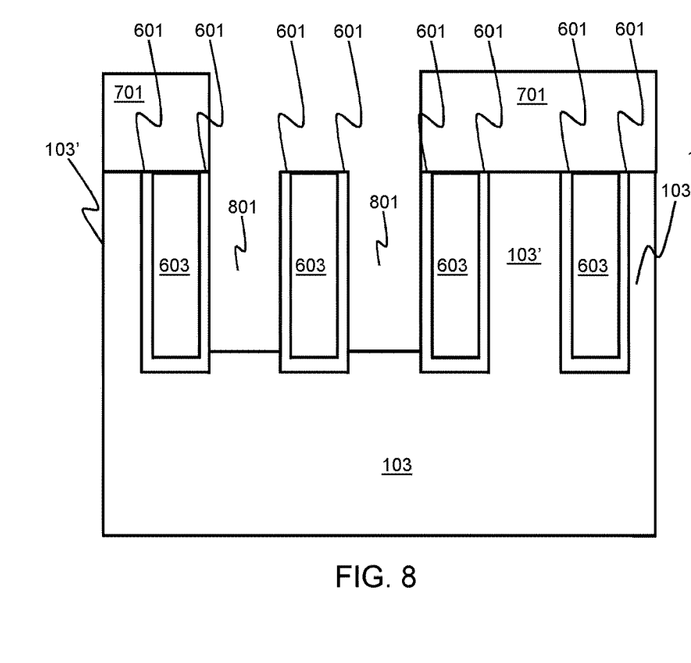
Figure 9:
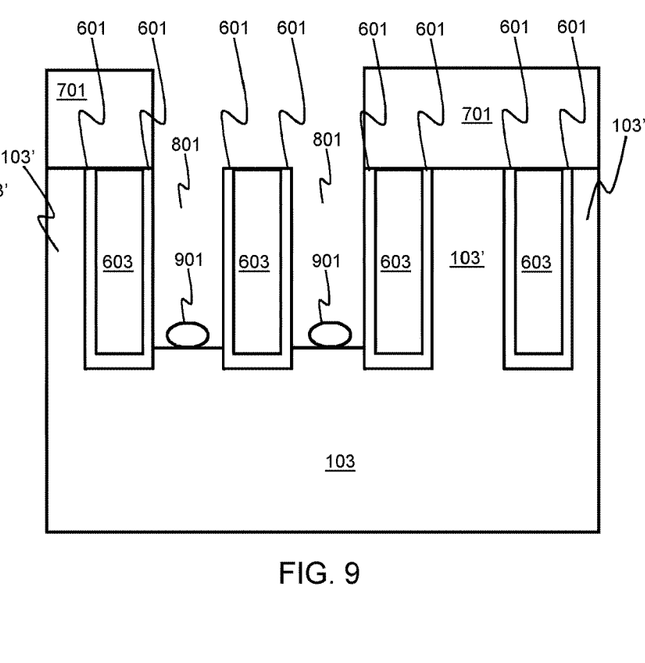

A photoresist and hardmask layer 701, e.g., titanium oxide ($TiO_2$), titanium nitride (TiN), amorphous carbon (a-C), SOH, SOC, $SiO_2$, or SiN, is formed over the Si, Ge, III-V, or $Si_xGe_{1-x}$ nanowires 103' with an opening to define III-V growth regions, as depicted in FIG. 7. Portions of the Si, Ge, or $Si_xGe_{1-x}$ nanowires 103' are then etched back to form trenches 801, as depicted in FIG. 8. Adverting to FIG. 9, the trenches 801 may be pre-cleaned (not shown for illustrative purposes), and a metal nanoparticle 901, e.g., Al, Ni, Ga, is deposited in each trench 801 by self-assembly in sol-gel or by direct deposit. Pre-cleaning the trenches 801 helps the nanoparticle 901 to stick to the Si, Ge, or $Si_xGe_{1-x}$ substrate 103 in the trenches 801. The type of metal nanoparticles 901 deposited in the trenches 801 also depends on the type of doping of the Si, Ge, or $Si_xGe_{1-x}$ substrate 103, e.g., Al or Ga may be deposited for p+ doping and antimony (Sb) or Ti may be deposited for n+ doping. Alternatively, in-situ doping of arsenic (As), phosphorous (P) (for n+), boron (B), nitrogen (N), Ga (for p+) can be done during the CVD or VLS growth of the nanowires.

Figure 10:
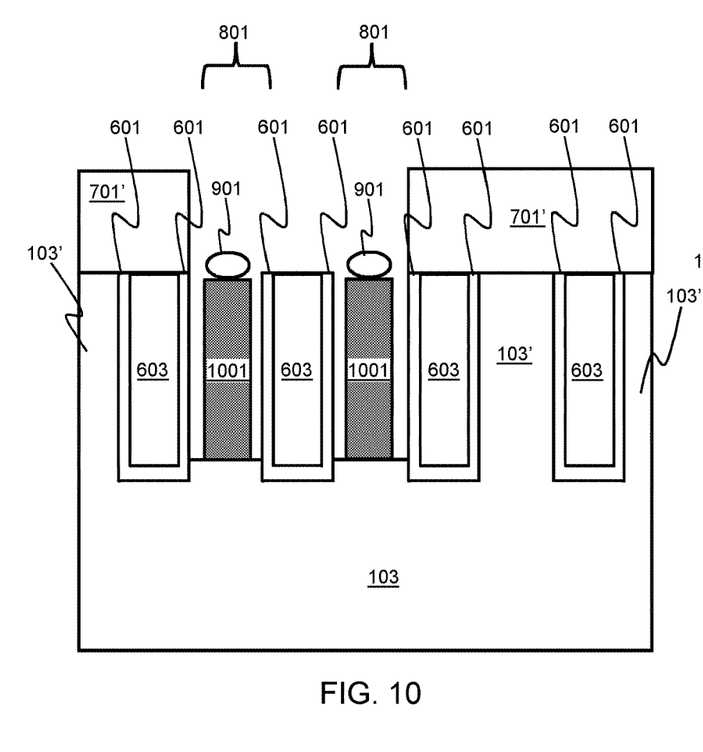

Adverting to FIG. 10, the photoresist of the photoresist and hardmask layer 701 is removed, leaving just the hardmask 701', and III-V or III-$V_xM_y$ nanowires 1001 are grown to a desired height in the trenches 801, e.g., by a metal catalyst VLS growth or CVD. Ni, Al, Au, Ag, Ti, Er, Pt, Pd, In, Sn, Sb, Zr, V, Hf, W, Co, Ta, La, Ga, Ru, Mo, or Fe may be used as the metal catalyst depending on the type of doping performed on the Si, Ge, or $Si_xGe_{1-x}$ substrate 103. Alternatively, the self-assembly of the III-V or III-$V_xM_y$ nanowires 1001 could be achieved through plasma treatment of the exposed surfaces of trenches 801, wet chemistry treatment, or thiol molecule chemistry with axial and radial doping possible. The III-V or III-$V_xM_y$ nanowires 1001 may also completely fill the trenches 801 (not shown for illustrative purposes). The remainder of masking layer 701 and metal nanoparticles 901 are then removed. Next, DPN or direct plasma oxidation (DPO) (not shown for illustrative convenience) is performed to passivate the nanowire surfaces and help with gap-fill. Thereafter, a protective layer 1101, e.g., formed of oxide/SOH, is deposited between each III-V or III-$V_xM_y$ nanowire 1001 and the sidewalls of the corresponding trench 801. The protective layer 1101 is then planarized, e.g., by CMP, as depicted in FIG. 11.

Next, a photoresist and hardmask layer 1201 is formed over each III-V or III-$V_xM_y$ nanowire 1001 to enable the Si, Ge, or $Si_xGe_{1-x}$ nanowire 103' regions to be opened, as depicted in FIG. 12. Adverting to FIG. 13, the photoresist and hardmask layer 1201 is then removed resulting in integrated Si, Ge, or $Si_xGe_{1-x}$ nanowires 103' and III-V or III-$V_xM_y$ nanowires 1001 on a single substrate.

Figure 6:
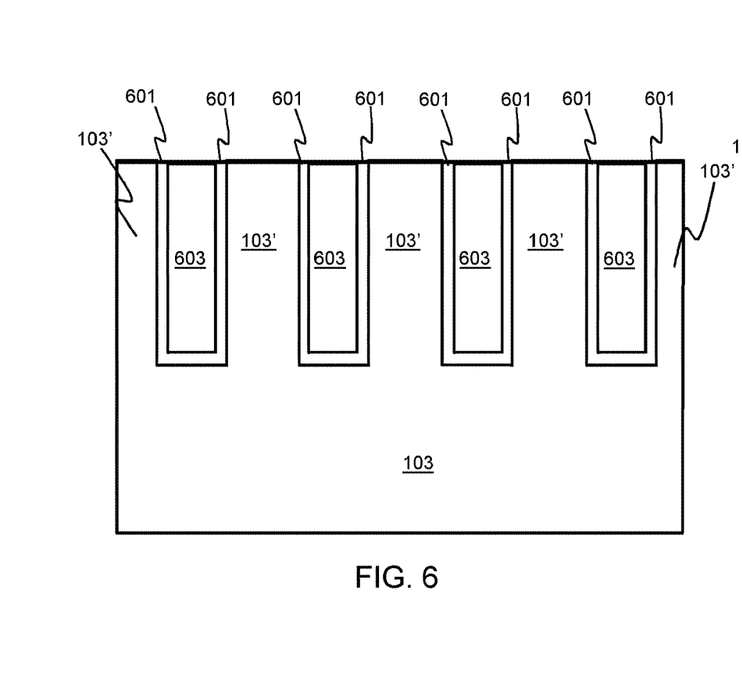

Alternatively, the substrate 103 may be formed of III-V material, in which case the planarization of the $SiO_x$ layer 603 and/or all of the layers 601, 603, 101, and 105 in FIG. 6 would define the III-V nanowires 103'. Further, the opening shown in FIG. 7 would define Si growth regions, and when the photoresist of the photoresist and hardmask layer 701 is removed in FIG. 10, leaving just the hardmask 701', Si nanowires 1001 would be grown to a desired height in the trenches 801, e.g., by depositing a Ni or Au nanoparticle in each trench 801 by self-assembly in sol-gel, MOCVD, or ALD. Then, the removal of the photoresist and hardmask 1201 in FIG. 13 would result in integrated III-V nanowires 103' and Si nanowires 1001 on a single substrate.

Figure 14:
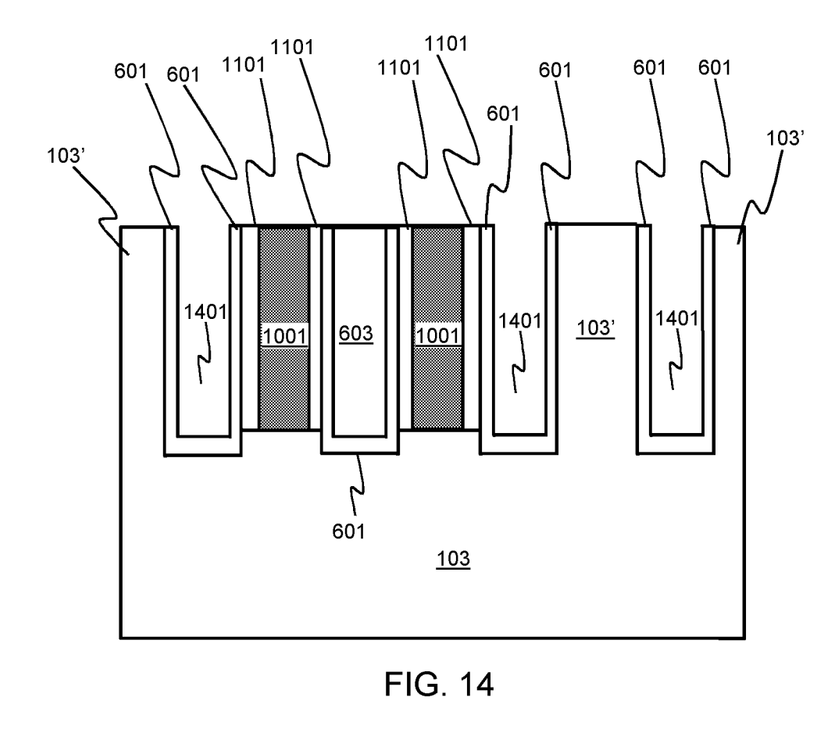

Adverting to FIG. 14, the $SiO_x$ layer 603 is removed forming trenches 1401, which can be subsequently used to perform source/drain and gate formation steps. The SiN, $SiO_xC_yN_z$, or DPN layer 601 may also be removed (not shown for illustrative convenience). Further, shallow trench isolation regions (not shown for illustrative convenience) may also be formed between the Si, Ge, or $Si_xGe_{1-x}$ nanowires 103' and the III-V or III-$V_xM_y$ nanowires 1001 or between the III-V nanowires 103' and the Si nanowires 1001 depending on the substrate material.

FIGS. 15 through 22 (cross-sectional views) schematically illustrate another process flow for forming Si or Ge-based and III-V based vertically integrated nanowires on a single substrate for mixed signal circuits, in accordance with an exemplary embodiment. Adverting to FIG. 15, a substrate stack 1501 is sequentially formed with a Si substrate 1503, a buffered silicon oxide layer 1505, an a-Si or doped poly-Si layer 1507, a SiN layer 1509, a SiOC layer 1511, and a SiN layer 1513. The particular material composition of the substrate stack 1501 may be determined to achieve optimum RIE and wet etch selectivities, e.g., for fabricating gate contacts at a later time. Further, the single substrate may alternatively be formed of Si, SiGe, III-V, or a combination thereof.

Figures 15, 16:
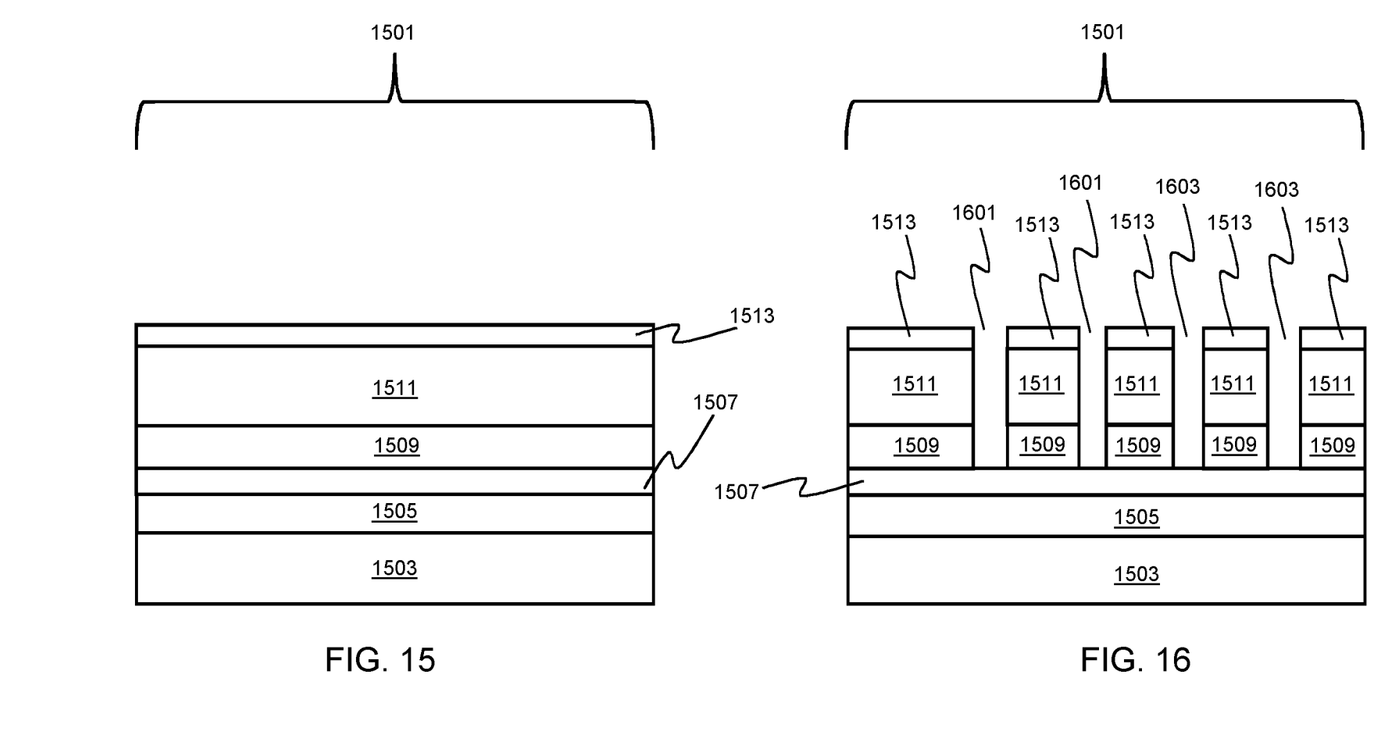
FIGS. 15 through 22 schematically illustrate another process flow for forming Si or Ge-based and III-V based vertically integrated nanowires on a single substrate for mixed signal circuits, in accordance with an exemplary embodiment.
Figure 17:
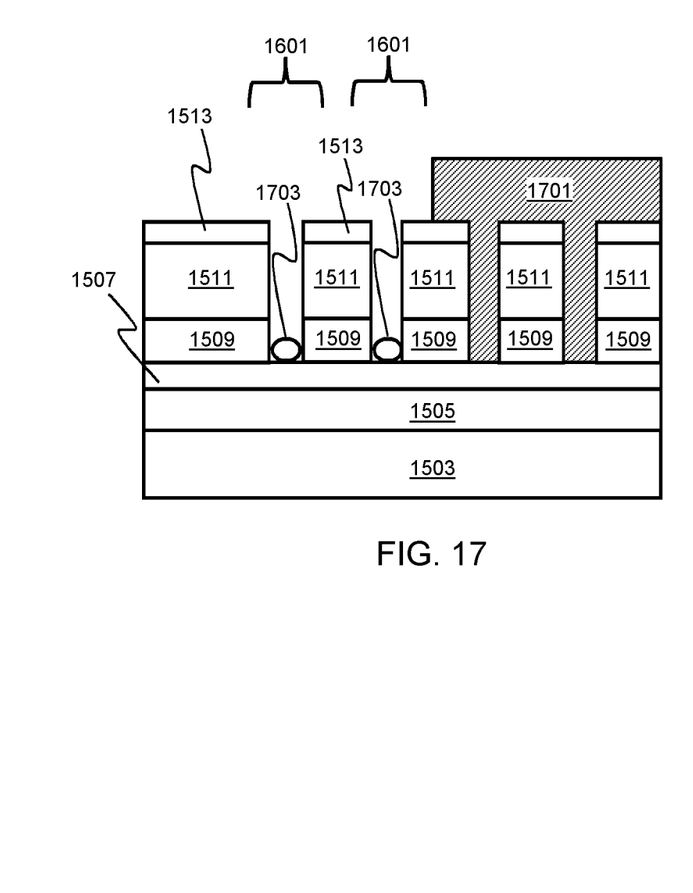
Figure 18:
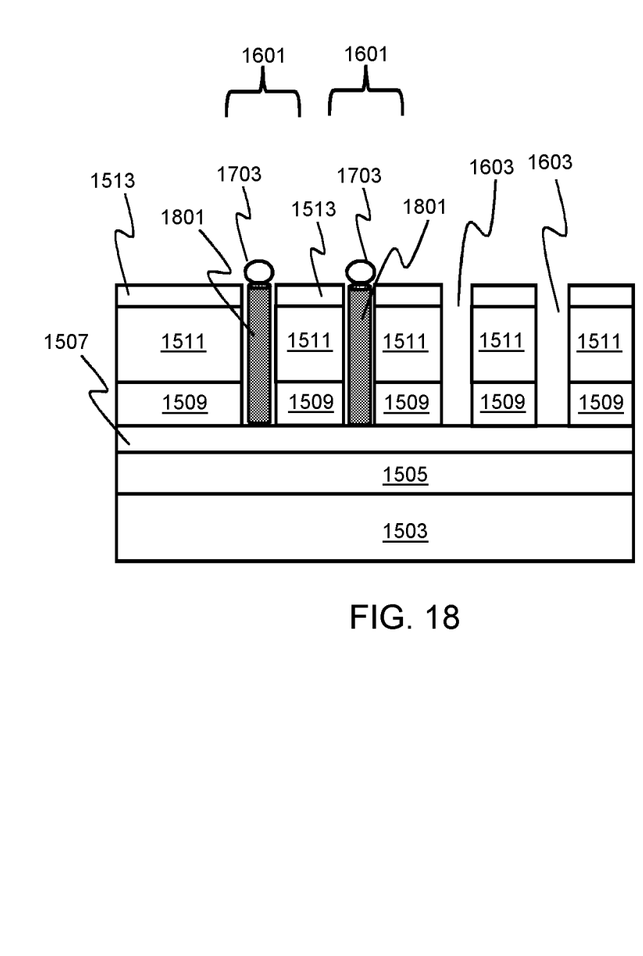

Adverting to FIG. 16, trenches 1601 and 1603 are formed in the substrate stack 1501 down to the a-Si/poly-Si layer 1507 to define the areas for subsequent nanowire growth. A mask 1701 is then formed over the trenches 1603, as depicted in FIG. 17. Next, metal nanoparticles 1703, e.g., Ni or Au, are deposited, e.g., by self-assembly in sol-gel or MOCVD, in the trenches 1601. As described in FIG. 9, the trenches 1603 may be pre-cleaned (not shown for illustrative convenience) to help the nanoparticles 1703 to stick to the a-Si layer 1507. Si, Ge, or $Si_xGe_{1-x}$ nanowires 1801 are then grown by a VLS or CVD process with in-situ doping to the desired height and the mask 1701 is removed, as depicted in FIG. 18.

Figure 19:
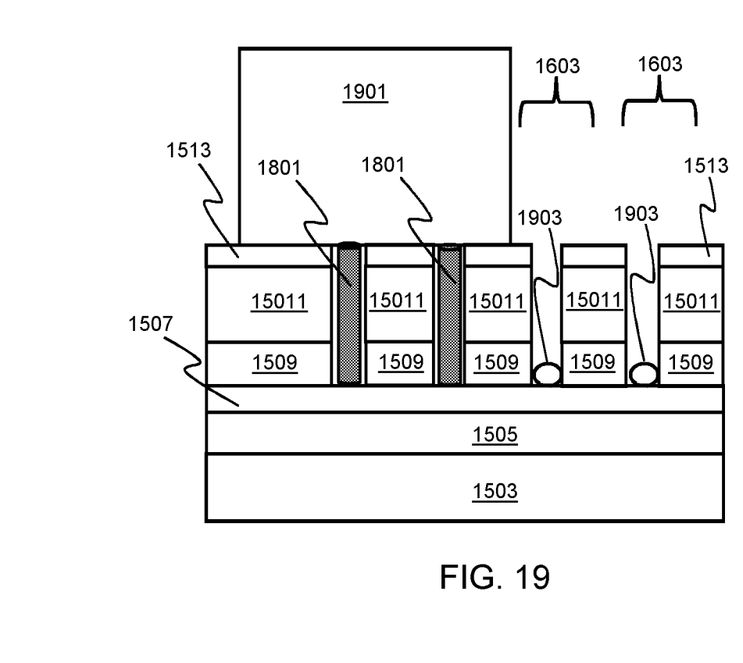
Figure 20:
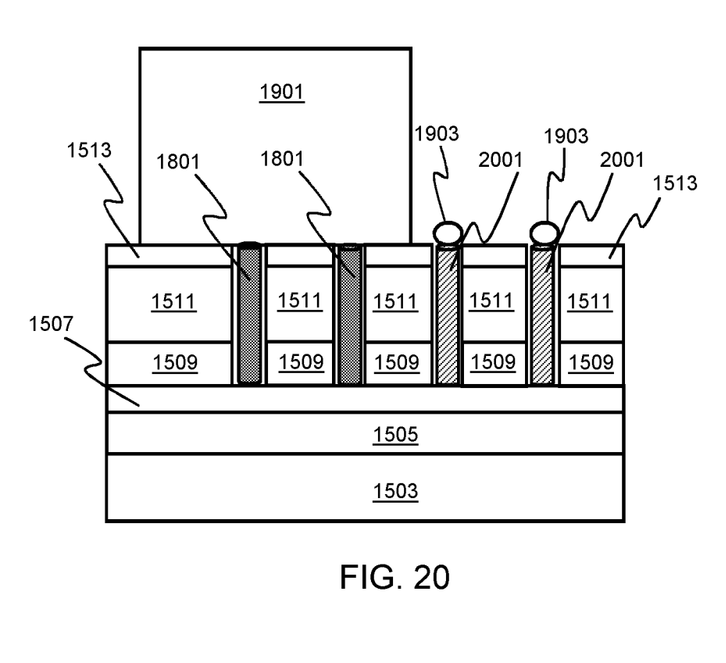
Figure 21:
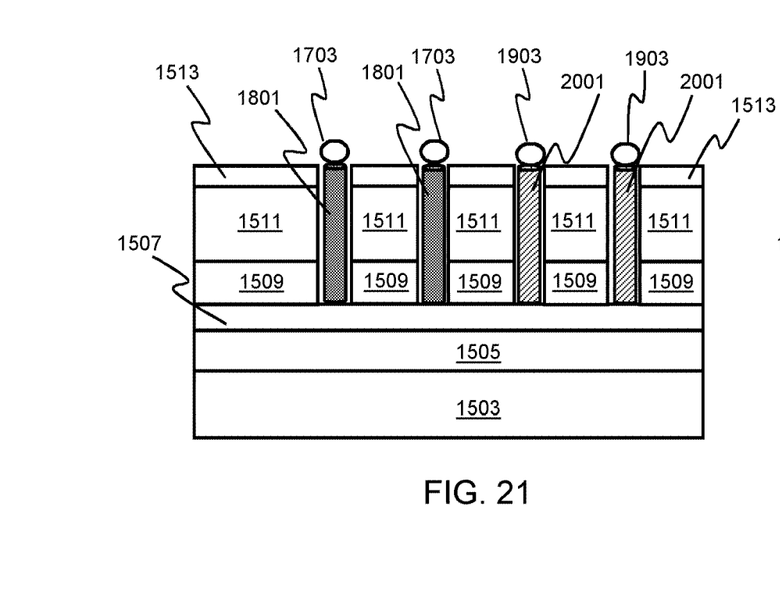
Figure 22:
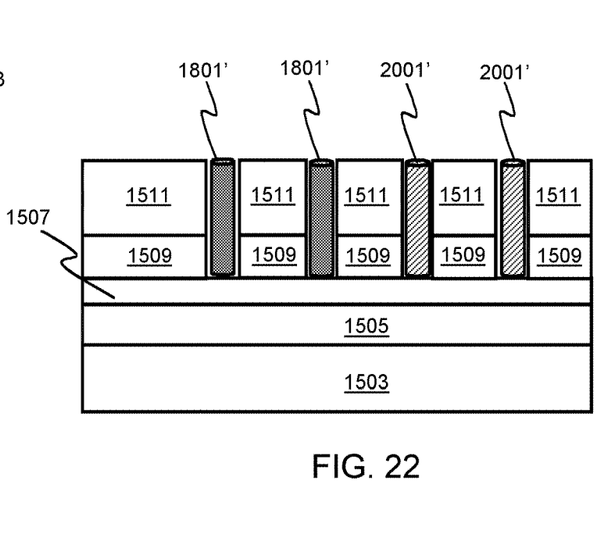

Next, a mask 1901 is formed over the Si, Ge, or $Si_xGe_{1-x}$ nanowires 1801, and metal nanoparticles 1903, e.g., Al, Ni, or Ga, are deposited, e.g., by self-assembly in sol-gel or by MOCVD, in the trenches 1603, as depicted in FIG. 19. Again, the trenches 1603 may be pre-cleaned before the metal nanoparticles 1903 are deposited. Thereafter, III-V or III-$V_xM_y$ nanowires 2001, e.g., formed of InP or GaAs, are grown to a desired height by a metal catalyst VLS or CVD growth with in-situ doping. Again, Ni, Al, Au, Ag, Ti, Er, Pt, Pd, In, Sn, Sb, Zr, V, Hf, W, Co, Ta, La, Ga, or Fe may be used as the metal catalyst. Alternatively, the self-assembly of the III-V or III-$V_xM_y$ nanowires 1903 could be achieved through plasma treatment of the exposed surfaces of trenches 1603, wet chemistry treatment, or thiol molecule chemistry with axial and radial doping possible. The mask 1901 is then removed, as depicted in FIG. 21. Adverting to FIG. 22, the nanoparticles 1703 and 1903 are removed, and the Si, Ge, or $Si_xGe_{1-x}$ nanowires 1801 and III-V or III-$V_xM_y$ nanowires 2001 are planarized, e.g., by CMP, down to the SiOC layer 1511, forming Si, Ge, or $Si_xGe_{1-x}$ nanowires 1801' and III-V or III-$V_xM_y$ nanowires 2001'. Thereafter, source/drain and gate formation steps may be performed.

The embodiments of the present disclosure can achieve several technical effects including heterogeneous integration of Si or Ge-based and III-V-based channels for vertical FETs on a single substrate enabling, both digital and analog logic to be integrated on a single chip. Integration of self-assembled VLS or CVD growth of nanowires using a metal catalyst with different precursors can also enable the formation of self-aligned vertical nanowires that enable low voltage/power with multiple scaling options and substantial transistor packing density relative to known fin field effect transistor (FinFET) structures. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability with respect to FET structures with vertical nanowire channels.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a substrate stack including an amorphous silicon (a-Si) followed by n or p doping or doped polysilicon (poly-Si) layer and a silicon oxycarbide (SiOC) layer;
    forming first and second groups of trenches in the substrate stack down to the doped a-Si/poly-Si layer of the substrate stack;
    forming a first mask over the second group of trenches;
    forming silicon (Si), germanium (Ge) or silicon germanium ($Si_xGe_{1-x}$) nanowires in the first group of trenches;
    removing the first mask and forming a second mask over the Si, Ge, or $Si_xGe_{1-x}$ nanowires;
    forming III-V nanowires in the second group of trenches;
    removing the second mask; and
    planarizing the Si, Ge, or $Si_xGe_{1-x}$ and III-V nanowires down to the SiOC layer.

2. The method according to claim 1, comprising forming the substrate stack by:
    forming a Si substrate;
    forming a buffer oxide layer over the Si substrate;
    forming the a-Si or doped poly-Si layer over the oxide layer;
    forming a first silicon nitride (SiN) layer over the a-Si or doped poly-Si layer;
    forming the SiOC layer over the first SiN layer; and
    forming a second SiN layer over the SiOC layer.

3. The method according to claim 1, comprising forming the trenches within the substrate stack by:
    self-aligned double patterning (SADP), self-aligned quadruple patterning (SAQP), direct surface assembly (nanoimprint), or extreme ultraviolet (EUV) lithography.

4. The method according to claim 1, comprising forming the Si, Ge, or $Si_xGe_{1-x}$ nanowires by:
    depositing a nickel (Ni) or gold (Au) nanoparticle in each of the first group of trenches by self-assembly in sol-gel or by metal organic chemical vapor deposition (MOCVD) or atomic layer growth (ALD); and
    growing the Si, Ge, or $Si_xGe_{1-x}$ nanowires to a desired height.

5. The method according to claim 4, comprising pre-cleaning the first group of trenches prior to depositing the Ni or Au nanoparticle.

6. The method according to claim 1, comprising forming the III-V nanowires by:
    depositing an aluminum (Al), Ni, or gallium (Ga) nanoparticle in each of the second group of trenches by self-assembly in sol-gel or by MOCVD, ALD;
    growing the III-V nanowires to a desired height by a metal catalyst vertical vapor liquid solid (VLS) growth or chemical vapor deposition (CVD) growth with in-situ doping during growth; and
    removing the second mask prior to planarizing the Si, Ge, or $Si_xGe_{1-x}$ and III-V nanowires.

7. The method according to claim 6, comprising pre-cleaning the second group of trenches prior to depositing the Al, Ni, or Ga nanoparticle.

8. The method according to claim 6, comprising planarizing the Si, Ge, or $Si_xGe_{1-x}$ and III-V nanowires by chemical mechanical planarization (CMP).

9. The method according to claim 1, comprising forming the III-V nanowires of a combination of indium phosphide (InP), indium arsenide (InAs), gallium nitride (GaN), or gallium arsenide (GaAs).

10. The method according to claim 1, wherein the metal catalyst comprises Ni, Al, Au, silver (Ag), titanium (Ti), erbium (Er), platinum (Pt), palladium (Pd), indium (In), Tin (Sn), antimony (Sb), Zirconium (Zr), vanadium (V), hafnium (Hf), tungsten (W), cobalt (Co), tantalum (Ta), lanthanum (La), ruthenium (Ru), molybdenum (Mo), Ga, or iron (Fe).

11. A method comprising:
    forming a substrate stack including an amorphous silicon (a-Si) followed by n or p doping or doped polysilicon (poly-Si) layer and a silicon oxycarbide (SiOC) layer;
    forming first and second groups of trenches by self-aligned double patterning (SADP), self-aligned quadruple patterning (SAQP), direct surface assembly (nanoimprint), or extreme ultraviolet (EUV) lithography in the substrate stack down to the doped a-Si/poly-Si layer of the substrate stack;
    forming a first mask over the second group of trenches;
    forming silicon (Si), germanium (Ge) or silicon germanium ($Si_xGe_{1-x}$) nanowires in the first group of trenches by VLS or chemical vapor deposition (CVD) process with in-situ doping;
    removing the first mask and forming a second mask over the Si, Ge, or $Si_xGe_{1-x}$ nanowires;
    forming III-V nanowires of a combination of indium phosphide (InP), indium arsenide (InAs), gallium nitride (GaN), or gallium arsenide (GaAs) in the second group of trenches by a metal catalyst VLS or CVD growth with in-situ doping;
    removing the second mask; and
    planarizing the Si, Ge, or $Si_xGe_{1-x}$ and III-V nanowires down to the SiOC layer by chemical mechanical planarization (CMP).

12. The method according to claim 11, comprising forming the substrate stack by:
    forming a Si substrate;
    forming a buffer oxide layer over the Si substrate;

forming the a-Si or doped poly-Si layer over the oxide layer;

forming a first silicon nitride (SiN) layer over the a-Si or doped poly-Si layer;

forming the SiOC layer over the first SiN layer; and forming a second SiN layer over the SiOC layer.

13. The method according to claim 11, comprising forming the Si, Ge, or $Si_xGe_{1-x}$ nanowires by:

pre-cleaning the first group of trenches;

depositing a nickel (Ni) or gold (Au) nanoparticle in each of the first group of trenches by self-assembly in sol-gel or by metal organic chemical vapor deposition (MOCVD) or atomic layer growth (ALD); and growing the Si, Ge, or $Si_xGe_{1-x}$ nanowires to a desired height.

14. The method according to claim 11, comprising forming the III-V nanowires by:

pre-cleaning the second group of trenches;

depositing an aluminum (Al), Ni, or gallium (Ga) nanoparticle in each of the second group of trenches by self-assembly in sol-gel or by MOCVD, ALD;

growing the III-V nanowires to a desired height by a metal catalyst vertical vapor liquid solid (VLS) growth or chemical vapor deposition (CVD) growth with in-situ doping during growth; and removing the second mask prior to planarizing the Si, Ge, or $Si_xGe_{1-x}$ and III-V nanowires.

* * * * *